United States Patent
Huang et al.

(10) Patent No.: US 7,791,070 B2
(45) Date of Patent: Sep. 7, 2010

(54) SEMICONDUCTOR DEVICE FAULT DETECTION SYSTEM AND METHOD

(75) Inventors: Tai-Chun Huang, Hsin-Chu (TW);
Chih-Hsiang Yao, Taipei (TW);
Kuan-Shou Chi, Hsin-Chu (TW);
Wen-Kai Wan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 484 days.

(21) Appl. No.: 11/264,911

(22) Filed: Nov. 2, 2005

(65) Prior Publication Data

US 2007/0096092 A1    May 3, 2007

(51) Int. Cl.
*G01R 31/26* (2006.01)
(52) U.S. Cl. .................. 257/48; 257/620; 257/622; 257/640; 257/773; 324/766
(58) Field of Classification Search ............ 257/48, 257/620, 622, 640, 773, E31.1; 324/765, 324/766
See application file for complete search history.

(56) References Cited

U.S. PATENT DOCUMENTS

| | | | |
|---|---|---|---|
| 6,365,958 B1 * | 4/2002 | Ibnabdeljalil et al. | 257/620 |
| 7,256,475 B2 * | 8/2007 | Jao et al. | 257/622 |
| 2003/0218254 A1 * | 11/2003 | Kurimoto et al. | 257/758 |
| 2005/0184362 A1 * | 8/2005 | Fujita | 257/620 |
| 2007/0096092 A1 * | 5/2007 | Huang et al. | 257/48 |

* cited by examiner

*Primary Examiner*—Michael B Shingleton
(74) *Attorney, Agent, or Firm*—Slater & Matsil, L.L.P.

(57) ABSTRACT

An outer border, and a seal ring substantially co-extensive with and spaced from the outer border is disclosed. A plurality of fault detection chains extend from adjacent the outer border to within the seal ring. At least a first one of the plurality of fault detection chains includes a contact pad, a first metal feature coupled to the contact pad by a first via in a passivation layer, a second metal feature coupled to the first metal feature by a second via, and a substrate contact coupled to the second metal feature by a third via.

20 Claims, 11 Drawing Sheets

SEMICONDUCTOR DEVICE FAULT DETECTION SYSTEM AND METHOD

TECHNICAL FIELD

The present invention relates generally to a system and method for improving semiconductor manufacturing and testing processes, and more particularly to a system and method for semiconductor device fault detection.

BACKGROUND

Generally, modern semiconductor devices are typically manufactured on a large wafer, with many discrete components, or "dice", on a single wafer, each die separated from its neighbor or unused wafer space by scribe lines. Each die can include a seal ring that encircles the die, forming an electrical and mechanical seal surrounding the various devices and circuits on the die. Once the manufacturing stages common to all dice are complete, the dice are physically separated, typically by sawing along the scribe lines.

The sawing process, however, can damage the dice. In particular, the mechanical stress caused by the saw can result in cracks and delamination in the die. The thermal stress caused by saw friction can also create or exacerbate cracks and delamination. Moreover, subsequent routine packaging and testing as well as device operation can cause the cracks and/or delamination to worsen. If the cracks and/or delamination become sufficiently damaging, performance degradation or total device failure can result, particularly if the faults penetrate the device's seal ring. Generally, these flaws are more common at the corners of the die, although they can also occur elsewhere. Accordingly, there have been attempts to test for cracks, delamination, and other flaws generated during the die sawing process.

One disadvantage of the prior art attempts to identify these flaws is that the information provided by current tests is limited. For example, C-mode Scanning Acoustic Microscopy (C-SAM) is a common method to search for flaws in semiconductor devices. However, typical C-SAM devices do not detect cracks and/or delamination flaws smaller than twenty micrometers (20 μm). Moreover, C-SAM typically cannot detect peeling layers, such as, for example, between the molding and passivation layer or between inter-metal dielectric (IMD) layers. Other methods, such as physical examination of a cross-section of the die, can themselves propagate cracks, making accurate assessment of the fault difficult. That is, the stress of the physical examination can mask the precise cause and extent of the crack or other flaw.

Another disadvantage of prior systems and methods is that, generally, failure analysis (FA) is particularly difficult during research and development. That is, theoretical assessments or predictive analysis of the damage caused by the sawing process is not currently possible. Additionally, failure testing during manufacturing is time-consuming, and often requires destructive testing, which destroys the product, regardless of whether it was in fact damaged. Thus, current systems and methods can be cost-prohibitive, particularly when applied to a large number of manufactured integrated circuits.

Another disadvantage of prior systems and methods is uncertainty introduced by not testing a statistically significant sample of the dice on a particular wafer or in a particular batch. Even minor flaws can worsen over time, especially during the thermal cycling of operational use. Thus, it becomes unclear whether or when a device or chip will fail, and unpredictable product failure can have a significant impact on the consumer or end-user. Additionally, current systems and methods do not provide for end-user testing for cracks, delamination, or other flaws. In particular, the disadvantages associated with manufacturer testing and analysis under current systems and methods are even more pronounced with respect to end-user testing.

Therefore, there is a need for a system and/or method for semiconductor device fault detection that overcomes at least some of the disadvantages associated with previous systems and methods.

SUMMARY OF THE INVENTION

These and other problems are generally solved or circumvented, and technical advantages are generally achieved, by preferred embodiments of the present invention, which provides a system and method for semiconductor device fault detection.

In accordance with a preferred embodiment of the present invention, an integrated circuit comprises a circuit region, an outer border, and a seal ring substantially co-extensive with and spaced from the outer border. A plurality of fault detection chains extend from adjacent the outer border to within the seal ring. At least a first one of the plurality of fault detection chains includes a contact pad, a first metal feature coupled to the contact pad by a first via in a passivation layer, a second metal feature coupled to the first metal feature by a second via, and a substrate contact coupled to the second metal feature by a third via.

In an alternate embodiment, an integrated circuit having an outer border comprises a circuit region and a seal ring adjacent said outer border. A first fault detection chain structure is disposed between the seal ring and the outer border, the first fault detection chain structure including a first top level metal contact electrically coupled to a first substrate contact. A second fault detection chain structure is disposed between the seal ring and the first fault detection chain structure and includes a second top level metal contact electrically coupled to a second substrate contact. A third fault detection chain structure is disposed between the seal ring and the circuit region and includes a third top level metal contact electrically coupled to a third substrate contact.

An advantage of a preferred embodiment of the present invention is identifying faults in a semiconductor die without destructive testing. In particular, a test voltage applied to the contact pad causes a detectable voltage condition. The detectable voltage condition is based on whether there is a fault in the semiconductor die that disrupts the conductive path formed by the fault detection chain structure.

A further advantage of a preferred embodiment of the present invention is identifying whether a fault in a semiconductor die likely extends through a seal ring formed on the semiconductor die. In particular, the third fault detection chain is configured inside the seal ring boundary such that a disruption in its conductive path indicates a high probability that the fault causing the disruption also passes through the seal ring.

Another advantage of a preferred embodiment of the present invention is identifying and locating a fault in a semiconductor die with additional specificity. In particular, the second fault detection chain and the third fault detection chain are configured such that their conductive paths bracket the seal ring. A disruption in the conductive path of one fault detection chain but not the other can indicate that a fault is present in the semiconductor die, but does not extend through the seal ring.

Yet another advantage of a preferred embodiment of the present invention is determining the extent and orientation of a detected fault in a semiconductor die. In particular, the first fault detection chain and the second fault detection chain can be configured such that their conductive paths are oriented in a particular area of the semiconductor die, such as, for example, a particular corner of the semiconductor die. Thus, by testing the continuity of the conductive paths of the fault detection chains, the general presence, extent, and orientation of a fault in the semiconductor die can be determined.

Yet another advantage of a preferred embodiment of the present invention is reducing manufacturing test time and expense. In particular, the fault detection chains can be configured such that fault testing does not require destroying the die under test. Additionally, the time required to test the die is reduced compared to prior systems and methods, and therefore, the expense associated with post-manufacture testing can be reduced. Furthermore, reduced expense can allow for testing of more dice, with improved accuracy.

Yet another advantage of a preferred embodiment of the present invention is improved post-packaging testing. In particular, the contact pad can be configured such that industry standard packaging and surface-mount technology pads couple to the contact pad. Thus, the semiconductor die can be tested at various points in its life cycle, which can improve performance data gathering. Additionally, end-user testing is improved, which can help identify catastrophic failure conditions before extensive damage to the system under test.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device manufacturing and testing environment. The invention may also be applied, however, in other semiconductor and/or integrated circuit design and manufacturing environments, as one skilled in the art will understand.

Figure 1:
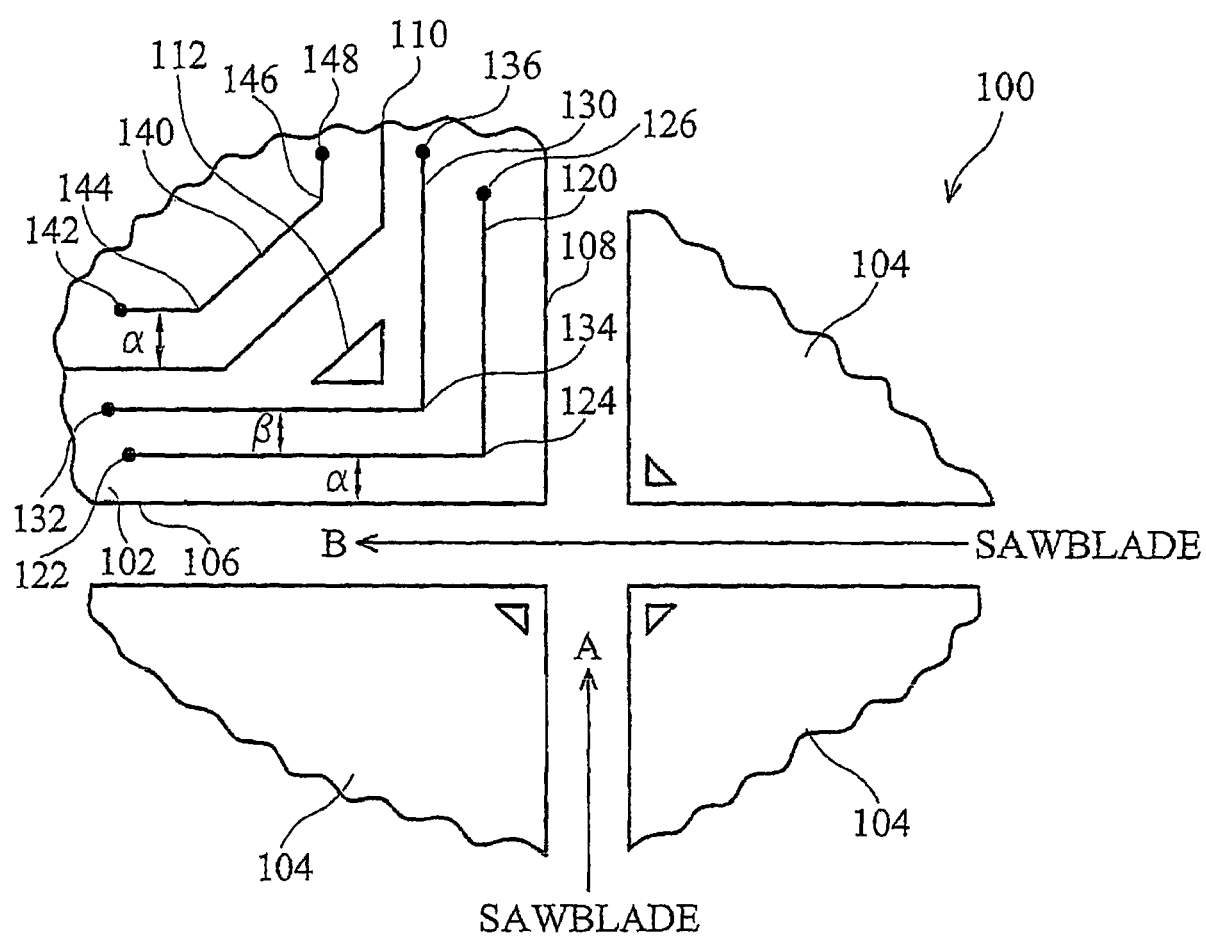
FIG. 1 is a top view illustrating features of a preferred embodiment of a semiconductor device fault detection system.

With reference now to FIG. 1, there is shown a top view illustrating a semiconductor fault detection device system, generally indicated by reference numeral 100. In particular, FIG. 1 depicts a semiconductor die 102 and a plurality of semiconductor dice 104. Generally, semiconductor die 102 and semiconductor dice 104 are formed on a common wafer and separated from each other through a mechanical process, typically through sawing. In the illustrated embodiment, semiconductor die 102 is separated from semiconductor dice 104 by sawing along the paths indicated by arrows "A" and "B". Separating semiconductor die 102 from semiconductor dice 104 leaves semiconductor die 102 with an edge 106 and an edge 108.

Semiconductor die 102 includes a seal ring 110 and a corner block 112, as one skilled in the art will understand. Semiconductor die 102 also includes fault detection chains 120, 130, and 140. Generally, as described in more detail below, fault detection chains 120, 130, and 140 are configured to provide conductive paths through which the mechanical and electrical integrity of semiconductor die 102 can be tested. In particular, fault detection chain 120 includes contacts 122, 124, and 126. Fault detection chain 130 includes contacts 132, 134, and 136. And fault detection chain 140 includes contacts 142, 144, 146, and 148.

Generally, a test voltage can be applied to one or more of the contacts to test the conductivity of one or more of the conductive paths provided by fault detection chains 120, 130, and 140. For example, a test voltage applied to contacts 122 and 126 can test the continuity profile of the conductive path of fault detection chain 120. One skilled in the art will understand that testing the continuity profile of a conductive path can include measuring voltage, resistance, current, and/or a variety of other variables that can change based on the structural and/or electro-mechanical integrity of a conductive path between two points. As described in more detail below, the fault detection chains 120, 130, and 140 are generally configured such that their conductive paths' continuity changes in the presence of a detectable fault in semiconductor die 102. For example, a crack or delamination from edge 106 that passes through fault detection chain 120 will change the continuity profile of the conductive path between contacts 122 and 126.

If the crack or delamination does not pass through fault detection chain 130, the continuity profile of the conductive path between contacts 132 and 136 will not change. Thus, it can be determined that a crack or delamination or other fault exists between edge 106 and corner block 112 that extends at least as far as fault detection chain 120, but not as far as fault detection chain 130. Similarly, the continuity profile of the conductive path between contacts 142 and 148 would remain unchanged, absent an additional fault.

If the crack or delamination does pass through fault detection chain 130, the continuity profile of the conductive path between contacts 132 and 136 changes, establishing that the crack/delamination extends at least that far. If the crack or delamination also passes through fault detection chain 140, the continuity profile of the conductive path between contacts 142 and 148 will change. In the illustrated embodiment, fault detection chain 140 is located entirely within seal ring 110. Thus, a fault that extends through fault detection chain 140 establishes that the fault has also breached seal ring 110. One skilled in the art will understand that a fault that erodes the integrity of the seal ring 110 can greatly degrade the performance of the devices on semiconductor die 102, and can be sufficient cause to discard semiconductor device 102.

Additionally, fault detection chains 120, 130, and 140 can be configured such that the location of a fault in semiconductor die 102 can be located more precisely, as described in more detail below. In particular, in one embodiment, where the continuity profile of the conductive path between contacts 122 and 126 indicates a fault that extends through fault detection chain 120, the continuity profiles of the conductive paths between contacts 122 and 124 and contacts 124 and 126 can be tested to determine whether the fault extends from edge 106 or edge 108.

For example, where the continuity of the conductive path between contacts 124 and 126 is unchanged and the continuity of the conductive path between contacts 122 and 124 is changed, it can be deduced that the detected fault extends from or near edge 106 through fault detection chain 120 between contacts 122 and 124. Thus, one skilled in the art will understand that a series of continuity tests between contacts of fault detection chains 120, 130, and 140 can be configured to detect and identify an approximate extent and/or location of faults in semiconductor die 102.

In the illustrated embodiment, fault detection chain 120 is oriented at a distance "alpha" ($\alpha$) from edge 106 and edge 108. Similarly, fault detection chain 130 is oriented at a distance "beta" ($\beta$) from fault detection chain 120 and fault detection chain 140 is oriented at a distance "gamma" ($\gamma$) from seal ring 110. The precise distances $\alpha$, $\beta$, and $\gamma$, can be determined based on a variety of factors, including, for example, the size of semiconductor device 102, design rules for semiconductor device 102, variables relating to the wafer on which semiconductor 102 is manufactured, kerf width between adjacent dice on the wafer, and other factors, as one skilled in the art will understand.

Figure 2:
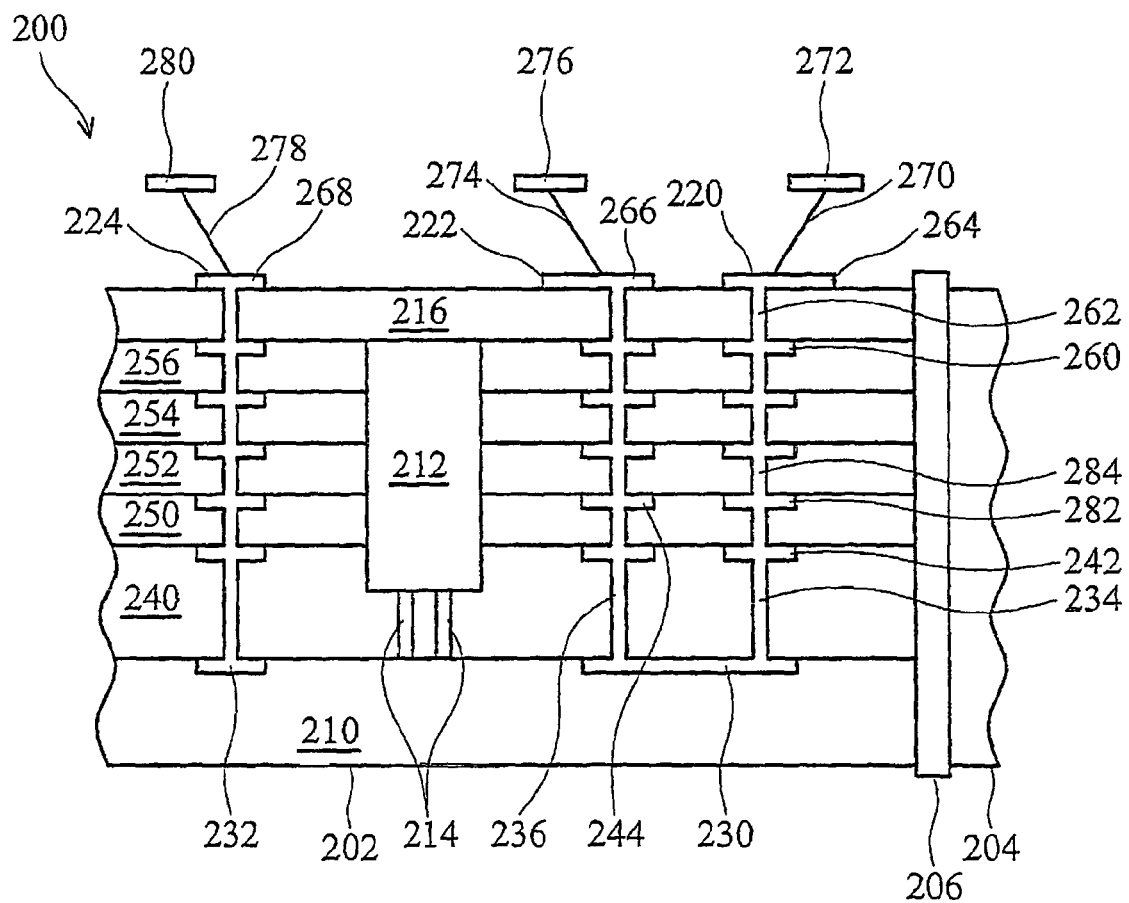
FIGS. 2-5 are cross sectional views illustrating features of a preferred embodiment of a semiconductor device fault detection system.

With reference now to FIG. 2, there is shown a cross sectional view illustrating a semiconductor fault detection device system, generally indicated by reference numeral 200. In particular, FIG. 2 illustrates a cross sectional view of a semiconductor die 202 in accordance with one embodiment of the present invention. As illustrated, semiconductor die 202 is separated from adjacent semiconductor die 204 through sawing by saw blade 206, as one skilled in the art will understand.

Semiconductor die 202 includes substrate 210, which is an otherwise conventional semiconductor device substrate. Semiconductor die 202 includes seal ring 212, which is an otherwise conventional semiconductor device seal ring and is formed in the layers above substrate 210, described in more detail below, as one skilled in the art will understand. Seal ring 212 couples to substrate 210 through seal ring contacts 214, which are otherwise conventional contacts suitable to couple a seal ring to the substrate. As illustrated, seal ring 212 passes through the layers above substrate 210 to the top substantially continuous layer of semiconductor die 202, passivation layer 216. Passivation layer 216 is an otherwise conventional passivation layer, as one skilled in the art will understand.

In the illustrated embodiment, semiconductor die 202 is configured with three fault detection towers 220, 222, and 224. In one embodiment, fault detection tower 220 corresponds to fault detection chain 120, fault detection tower 222 corresponds to fault detection chain 130, and fault detection tower 224 corresponds to fault detection chain 140 of FIG. 1. In the illustrated embodiment, fault detection tower 220 is coupled to fault detection tower 222 and substrate 210 through doped region 230, and fault detection tower 224 is coupled to substrate 210 through doped region 232.

Doped regions 230 and 232 are otherwise conventional heavily doped regions, and can be n-type or p-type regions, according to whether substrate 210 is an n-type or p-type substrate, as one skilled in the art will understand. Generally, doped region 230 serves as an electrical conduit between fault detection tower 220, fault detection tower 222, and substrate 210 and doped region 232 serves as an electrical conduit between fault detection tower 224 and substrate 210.

Generally, the fault detection towers are configured with a series of metal features coupled by vias that form an electrical conductive path between the doped region and a top-level contact. The conductive path formed by the metal features and vias passes through the various layers of the semiconductor device, such as, for example, the inter-layer dielectric (ILD) layer and the inter-metal dielectric layers (IMDs). Thus, the fault detection towers are disposed from the substrate, through the doped region, to and through the passivation layer.

Thus, for example, doped region 230 couples to M1 via 234 of fault detection tower 220 and to M1 via 236 of fault detection tower 222. M1 via 234 and M1 via 236 are otherwise conventional vias, as one skilled in the art will understand. Generally, M1 via 234, M1 via 236, and seal ring contacts 214 are formed in the first layer above substrate 210, that is, inter-layer dielectric (ILD) 240, which is an otherwise conventional inter-layer dielectric layer.

M1 via 234 couples to a metal feature, M1 trench 242, of fault detection tower 220 and M1 via 236 couples to a metal feature, M1 trench 244, of fault detection tower 222. M1 trench 242 and M1 trench 244 are otherwise conventional metal features formed in trenches, oriented just below the layer above ILD 240, inter-metal dielectric (IMD) 250, which is an otherwise conventional inter-metal dielectric layer, as one skilled in the art will understand.

The series of vias and metal features continues through the remaining layers of the semiconductor device to the top layer below the passivation layer, the Mn layer. For example, Mn trench 260 couples to contact 264 through contact via 262, formed in passivation layer 216. One skilled in the art will understand that fault detection towers 222 and 224 are thus formed in a similar fashion.

For ease of illustration, semiconductor die 202 is depicted with four IMD layers, IMD 250, IMD 252, IMD 254, and IMD 256. One skilled in the art will understand that semiconductor die 202 can be configured with more than four IMD layers, less than four IMD layers, or otherwise suitably configured. Accordingly, the top or uppermost trench/vias are designated "Mn trench" and "Mn via" to account for these other embodiments. Thus, passivation layer 216 is formed above IMD 256, the "Mn" layer.

In the illustrated embodiment, semiconductor die 202 includes a plurality of packaging connections. In particular, semiconductor die 202 includes link 270, which couples contact 264 to a packaging connection 272. Similarly, link 274 couples contact 266 to packaging connection 276 and link 278 couples contact 268 to packaging connection 280. One skilled in the art will understand that other configurations can also be employed. Links 272, 274, and 278 are otherwise conventional electrical connections suitable to couple a contact with a packaging connection. Packaging connections 272, 276, and 280 are otherwise conventional packaging connections, as one skilled in the art will understand.

Accordingly, one skilled in the art will understand that the above components form certain conductive paths that can be tested, to determine whether the conductive path has been severed. Generally, the fault detection towers are configured to operate as follows. Fault detection towers 220 and 222 are configured such that a voltage applied to contact 264 of fault detection tower 220 causes a detectable voltage condition at contact 266 of fault detection tower 222. This detectable voltage condition varies based on whether there is a detectable fault in semiconductor die 202. For example, where a crack has formed between IMD 250 and IMD 252 extending from the edge of semiconductor die 202 nearest saw blade 206 towards seal ring 212, but not through fault detection tower 220, the voltage condition at contact 266 is substantially indistinguishable from the voltage condition absent the crack.

However, if the crack extends through fault detection tower 220, decoupling, for example, M2 trench 282 and M3 via 284 for example, the voltage condition at contact 266 is observably different from the voltage condition absent the crack. In particular, absent a fault, a positive voltage applied to contact 264 causes a positive voltage at contact 266. If a fault extends through fault detection tower 220, a voltage applied to contact 264 does not cause a positive voltage at contact 266, as one skilled in the art will understand.

Thus, one skilled in the art will understand that by applying a voltage to contact 264, the presence or absence of a positive voltage at contact 266 indicates whether the conductive path between the two contacts, the fault detection towers, is, severed. Thus, in the illustrated embodiment, if a voltage applied to contact 264 does not result in a positive voltage at contact 266, a fault in semiconductor die 202 is detected that extends at least as far as fault detection tower 220.

Similarly, fault detection tower 224 is configured such that a voltage applied to contact 268 causes an observable voltage condition at contact 268, based on whether a detectable fault extends through fault detection tower 224. Thus, one skilled in the art will understand that by observing the voltage condition resulting from a voltage applied at contact 268, one can determine whether the conductive path between contact 268 and doped region 232 is severed, thereby indicating the presence or absence of a fault extending through fault detection tower 224.

Moreover, where a voltage test of fault detection towers 220 and 222 indicate a fault and a voltage test of fault detection tower 224 also indicates a fault, it can be determined that the fault detected through fault detection towers 220 and 222 likely extends through fault detection tower 224 and, therefore, through seal ring 212. Conversely, where a voltage test of fault detection towers 220 and 222 indicate a fault but a voltage test of fault detection tower 224 does not indicate a fault, it can be determined that the fault does not likely extend through fault detection tower 224 and, therefore it is less likely that the fault extends through seal ring 212.

In the illustrated embodiment, fault detection towers 220 and 222 are coupled together through doped region 230, thereby forming a conductive path between the fault detection towers. In an alternate embodiment, fault detection towers 220 and 222 can be configured similarly to fault detection tower 224. That is, fault detection tower 220 and fault detection tower 222 can be configured each with its own separate doped region in substrate 210. So configured, one can determine the extent of fault propagation with additional specificity.

For example, where a test of fault detection tower 220 indicates a fault but a test of fault detection tower 222 does not indicate a fault, it can be determined that the fault does not extend through fault detection tower 222 and, therefore, does not likely extend through seal ring 212. Where a test of fault detection tower 222 does indicate a fault, a test of fault detection tower 224 can help determine whether the detected fault likely extends through seal ring 212.

In the illustrated embodiment, fault detection towers 220, 222, and 224 are depicted as "wall-type" towers. In an alternate embodiment, fault detection towers 220, 222, and 224 are "pillar-type" towers. Additional detail regarding wall-type and pillar-type towers is provided below.

One skilled in the art will understand that fault detection towers 220, 222, and 224 can be configured such that a "fault-free" conductive profile of each fault detection tower absent a fault is known. Thus, the test-result conductive profile can be compared to the fault-free conductive profile to determine whether a fault is present. The magnitude of the deviation from the default conductive profile can indicate the presence and extent of a fault.

For example, as described above, where the conductive path between contact 264 and contact 266 is completely severed, a positive voltage applied to contact 264 does not cause a positive voltage at contact 266. In a wall-type tower configuration, however, completely severing the conductive path requires a fault that extends the width of the "wall." A detectable fault that does not completely sever the conductive path will nevertheless change the conductive profile of the conductive path, producing measurable changes at contact 266.

By measuring the observable changes at contact 266 under a variety of fault conditions in a laboratory test environment, a rough estimate of corresponding fault-types and conductive-profile-changes can be developed for a particular semiconductor die design and configuration. This rough correspondence can then be employed in a manufacturing test environment, testing the conductive profile, comparing the results to the rough correspondence to identify whether a fault is present and, if present, the nature and extent of the fault. Thus, the fault detection towers can be configured to support advanced fault detection at the manufacturing stage without requiring destructive testing.

Additionally, the foregoing and following description generally discusses voltage characteristics as the test criteria, serving as a proxy measuring the continuity of the conductive path. One skilled in the art will understand that other proxies can also be employed, such as, for example, current, resistance, capacitance, and other suitable proxies. Moreover, packaging connections 272, 276, and 280 can be configured for improved access to the associated contacts 264, 266, and 268 after packaging/mounting, which allows testing for faults that develop or degrade during the later stages of the overall manufacturing process. One skilled in the art will understand that thoughtful placement of the packaging connections can also allow end-user testing throughout the life cycle of semiconductor die 202.

Figure 3:
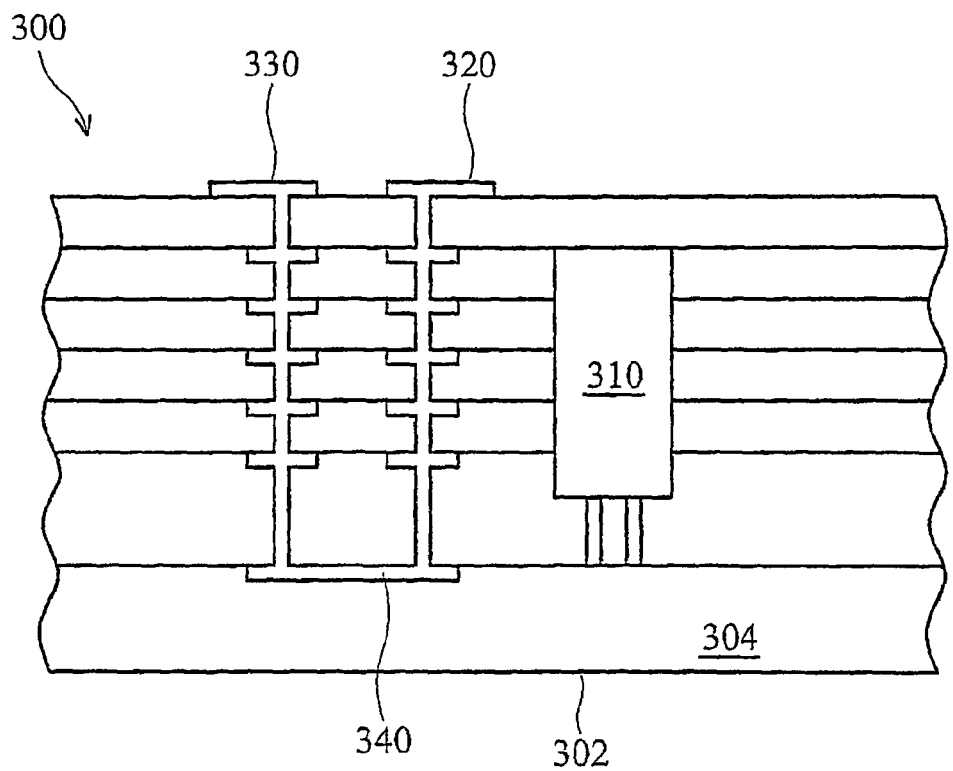

With reference now to FIG. 3, there is shown a cross sectional view illustrating a semiconductor fault detection device system, generally indicated by reference numeral 300. In particular, FIG. 3 illustrates one embodiment of the present invention, wherein two fault detection towers are coupled together and disposed inside the seal ring boundary, as one skilled in the art will understand.

In particular, semiconductor die 302 is configured with two fault detection towers 320 and 330, which are configured substantially similarly to fault detection towers 220 and 222 of FIG. 2. In an alternate embodiment, fault detection towers 320 and 330 can be configured similarly to fault detection tower 224 of FIG. 2. In the illustrated embodiment, fault detection tower 320 is coupled to fault detection tower 330 and substrate 304 through doped region 340. Accordingly, a disruption in the conductive paths of fault detection towers 320 and 330 indicates a fault within or inside the seal ring 310 boundary.

Figure 4:
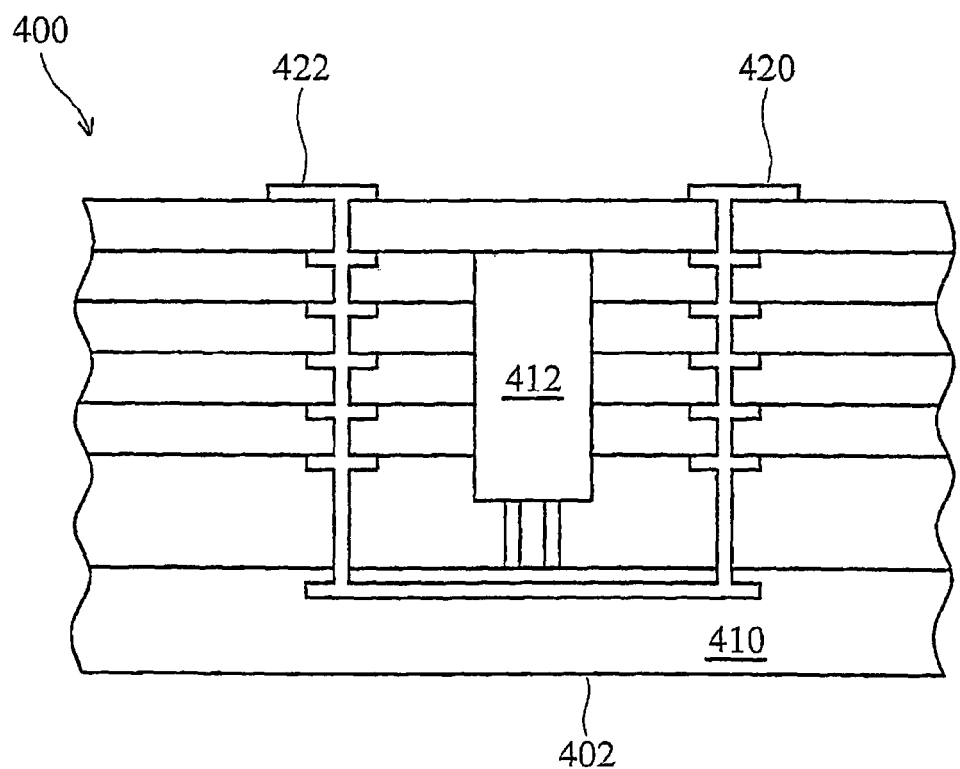

With reference now to FIG. 4, there is shown a cross sectional view illustrating a semiconductor fault detection device system, generally indicated by reference numeral 400. In particular, FIG. 4 illustrates one embodiment of the present invention, wherein two fault detection towers are coupled together, with one tower disposed outside the seal ring and one tower disposed inside the seal ring.

In particular, semiconductor die 402 is configured with two fault detection towers 420 and 422, which are configured substantially similarly to fault detection towers 220 and 222 of FIG. 2. In an alternate embodiment, fault detection towers 420 and 422 can be configured similarly to fault detection tower 224 of FIG. 2. As illustrated, fault detection tower 420 is configured outside seal ring 412 and fault detection tower 422 is configured inside seal ring 412. That is, seal ring 412 is interposed between fault detection tower 420 and fault detection tower 422. The conductive paths of fault detection towers 420 and 422 are coupled below seal ring 412, within substrate 410. Accordingly, a disruption in the conductive path of fault detection towers 420 or 422 can indicate a fault near the seal ring 412 boundary.

Figure 5:
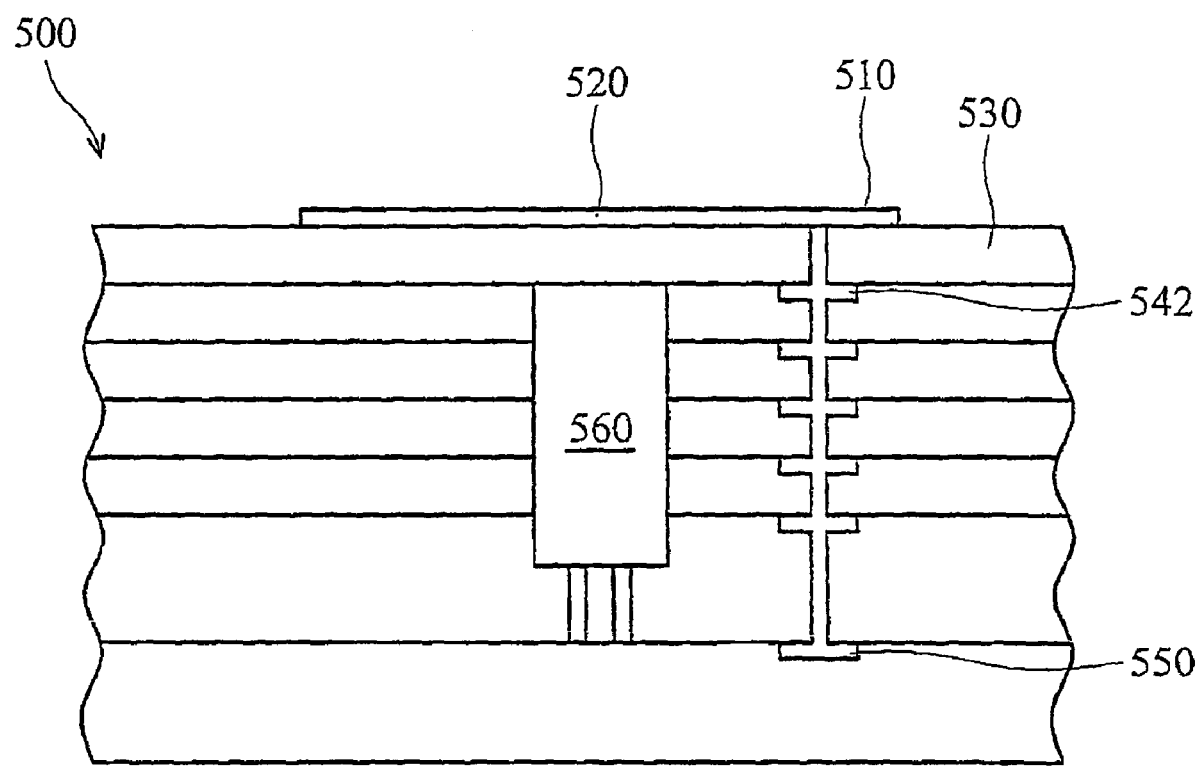

With reference now to FIG. 5, there is shown a cross sectional view illustrating a semiconductor fault detection device system, generally indicated by reference numeral 500. In particular, FIG. 5 depicts one embodiment of the present invention, wherein a single fault detection tower with an extended contact is disposed outside the seal ring. In the illustrated embodiment, fault detection tower 510 is configured substantially similarly to fault detection towers 224 of FIG. 2.

Fault detection tower 510 includes extended contact 520, which couples to passivation layer 530 and the series of vias 540 and trenches 542 between extended contact 520 and doped region 550. As illustrated, extended contact 520 is an otherwise conventional passivation layer contact that is configured to extend along passivation layer 530 above seal ring 560 within the seal ring 560 boundary.

Extended contact 540 generally extends from approximately the area directly above the bulk of fault detection tower 510, along passivation layer 530, to approximately an area substantially inside the seal ring 560 boundary area. One skilled in the art will understand that this configuration provides an enlarged contact area, which facilitates testing in both a laboratory and manufacturing environment. Additionally, the extended contact area facilitates conformity with design rules that require contact points to fall inside the seal ring 560 boundary area.

Figure 6:
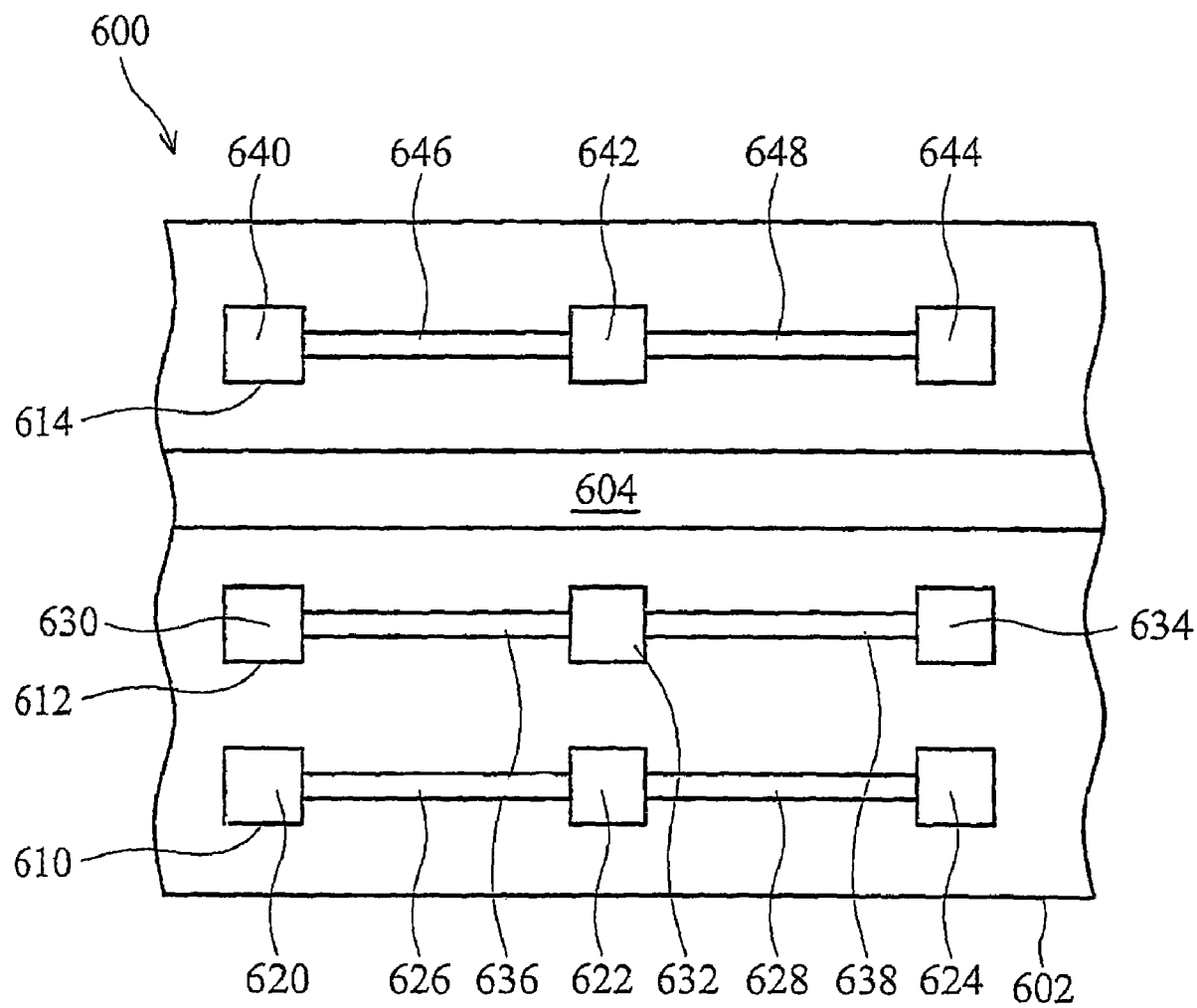
FIG. 6 is a top view illustrating features of a preferred embodiment of a semiconductor device fault detection system.

With reference now to FIG. 6, there is shown a top view illustrating a semiconductor fault detection device system, generally indicated by reference numeral 600. In particular, FIG. 6 illustrates a top view of a semiconductor die 602 with seal ring 604. Semiconductor die 602 includes three fault detection chains 610, 612, and 614. Fault detection chain 610 and fault detection chain 612 are configured between seal ring 604 and an outer edge 606 of semiconductor die 602. Fault detection chain 614 is configured inside seal ring 604.

Each fault detection chain includes a number of contacts coupled to one or more fault detection towers. In particular, fault detection chain 610 includes contacts 620, 622, and 624 and fault detection towers 626 and 628. Similarly, fault detection chain 612 includes contacts 630, 632, and 634 and fault detection towers 636 and 638 and fault detection chain 614 includes contacts 640, 642, and 644 and fault detection towers 646 and 648.

Generally, each fault detection chain forms a conductive path through the fault detection towers and contacts as described above. Accordingly, a voltage applied to one of the contacts in a fault detection chain can generate a measurable voltage condition at one or more of the other contacts in the fault detection chain. The voltage condition at the one or more of the other contacts varies based on whether there is a detectable fault in semiconductor die 602. By testing the voltage condition between two contacts on the same fault detection chain, the continuity of the conductive path between the two contacts can be determined, and therefore, the presence of a detectable fault between the two contacts can be determined. Thus, in general, fault detection chains 610, 612, and 614 can be configured to determine whether there is a detectable fault in semiconductor die 602, and whether a detected fault probably passes through seal ring 604.

In the illustrated embodiment, each fault detection chain is configured with three contacts. Thus, the approximate location of a detected fault can be determined with additional specificity, through testing the continuity of the conductive paths between various contacts, as one skilled in the art will understand. Additionally, while fault detection chains 610, 612, and 614 are depicted with three contacts, one skilled in the art will understand that more than three contacts can also be employed, such as, for example, at a periodic interval along each fault detection chain, or otherwise suitably configured.

In the illustrated embodiment, fault detection chains 610, 612, and 614 are configured to operate independently of each other. In an alternate embodiment, one or more of fault detection chains 610, 612, and 614 can be coupled together, as one skilled in the art will understand. Moreover, one skilled in the art will understand that semiconductor die 602 can also be configured with one, two, or four or more fault detection chains. Additionally, in the illustrated embodiment, fault detection towers 626, 628, 636, 638, 646, and 648 are configured as wall-type towers. In an alternate embodiment, one or more of the fault detection towers can be configured as pillar-type towers. One skilled in the art will understand that other configurations can also be employed.

Figure 7A:
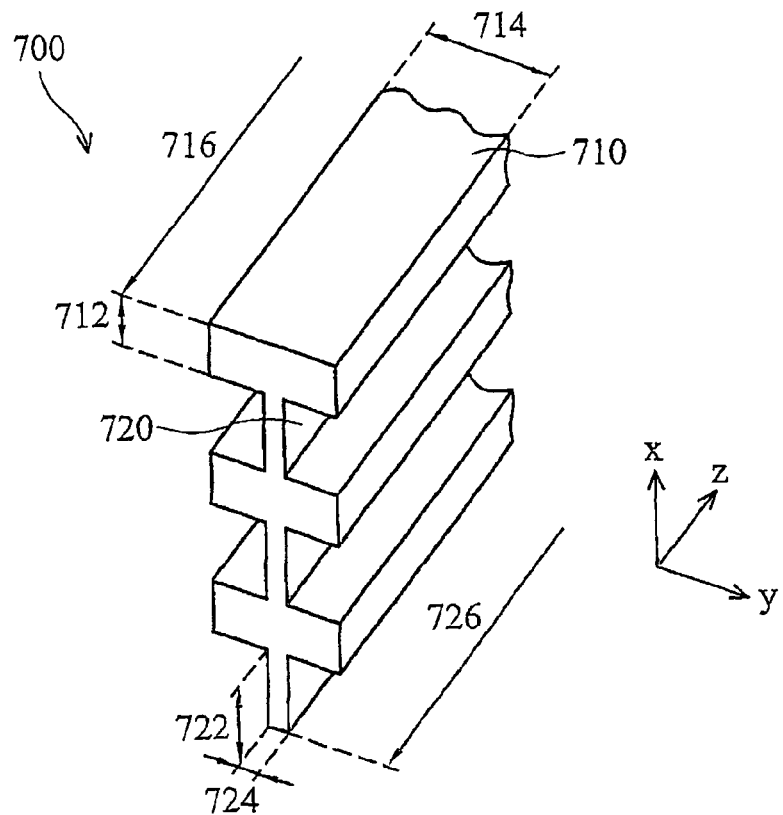
FIGS. 7A and 7B are perspective diagrams illustrating a semiconductor fault detection tower in accordance with one embodiment of the present invention.

With reference now to FIG. 7A, there is shown a perspective diagram illustrating a segment of a wall-type fault detection tower, generally indicated by reference numeral 700. In particular, fault detection tower 700 includes a plurality of metal features 710 and vias 720. Each metal feature 710 is configured with a height 712, a width 714, and a length 716. Similarly, each via 720 is configured with a height 722, a width 724, and a length 726. Generally, each metal feature 710 is configured with a substantially similar height 712, width 714, and length 716 and each via 720 is configured with a substantially similar height 722, a width 724, and length 726. One skilled in the art will understand, however, that the height 712, width 714, and length 716 of metal features 710 can vary from the height 722, width 724, and length 726 of vias 720.

As described above, fault detection tower 700 is configured as a wall-type fault detection tower. Accordingly, length 716 of metal feature 710 is substantially longer than height 712 or width 714. Similarly, length 726 of via 720 is substantially longer than height 722 or width 724. One skilled in the art will understand that length 716 and length 726 can be configured so as to approximately match the separation between contacts coupled to fault detection tower 700.

Figure 7B:
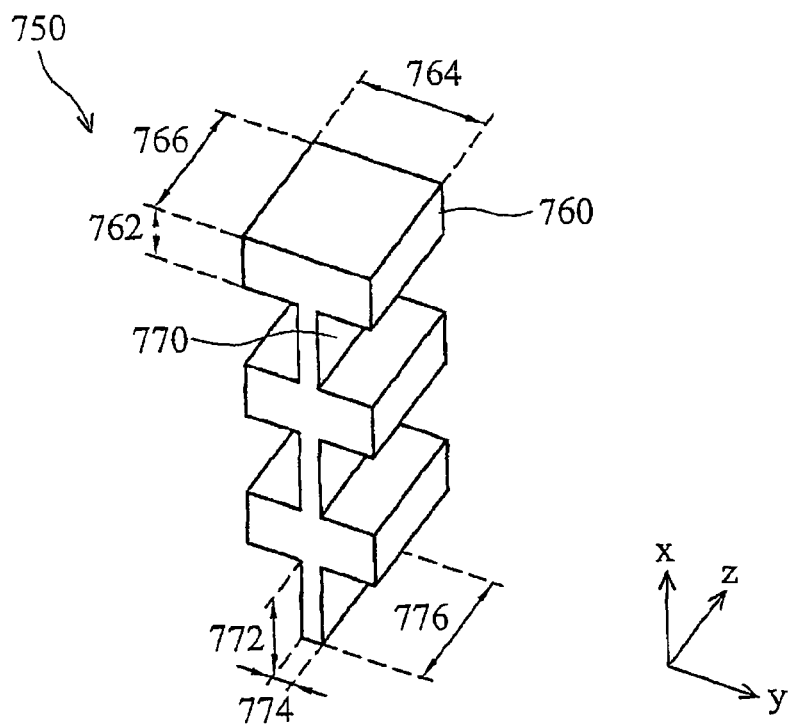

With reference now to FIG. 7B, there is shown a perspective diagram illustrating a segment of a pillar-type fault detection tower, generally indicated by reference numeral 750. In particular, fault detection tower 750 includes a plurality of metal features 760 and vias 770. Each metal feature 760 is configured with a substantially similar height 762, width 764, and length 766 and each via 770 is configured with a substantially similar height 772, width 774, and length 776.

As described above, fault detection tower 750 is configured as a pillar-type fault detection tower. Accordingly, length 766 of metal feature 760 is approximately equivalent to width 764. Similarly, length 776 of via 770 is approximately equivalent to width 774. Thus, one skilled in the art will understand that length 766 and length 776 of pillar-type fault detection tower 750 can be substantially smaller than length 716 and length 726 of wall-type fault detection tower 700 of FIG. 7B.

Figure 8A:
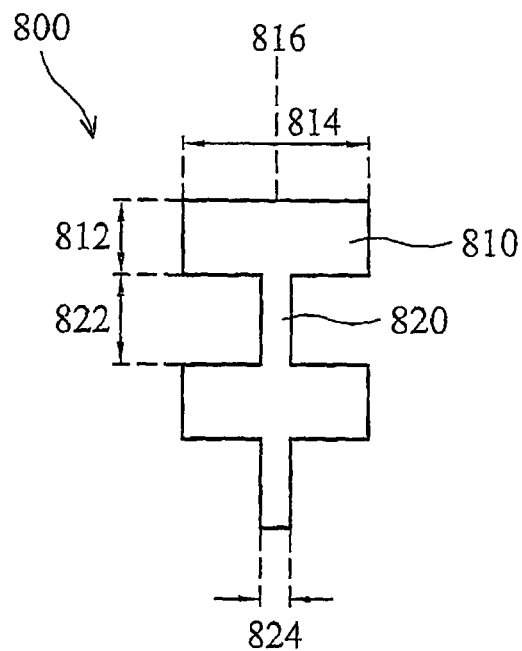
FIGS. 8A and 8B are cross sectional views illustrating a semiconductor fault detection tower in accordance with one embodiment of the present invention.

With reference now to FIG. 8A, there is shown a cross sectional view illustrating a fault detection tower, generally indicated by reference numeral 800. In particular, fault detection tower 800 includes a plurality of metal features 810 and vias 820. Each metal feature 810 is shown with a height 812 and a width 814. Similarly, each via 820 is shown with a height 822 and a width 824.

Additionally, the approximate midpoint along the width 814 of metal feature 810 is indicated by midpoint 816. In the illustrated embodiment, each via 820 is aligned with the midpoint 816 of the metal feature 810 above it. In an alternate embodiment, vias 820 can be aligned at other points relative to midpoint 816.

Figure 8B:
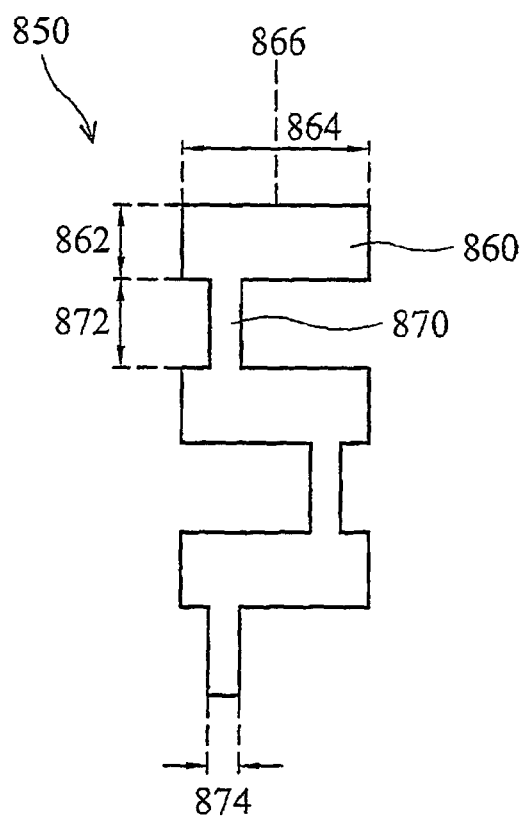

For example, with reference now to FIG. 8B, there is shown a cross sectional view illustrating a fault detection tower, generally indicated by reference numeral 850. In particular, fault detection tower 850 includes a plurality of metal features 860 and vias 870. Each metal feature 860 is shown with a substantially similar height 862 and width 864 and each via 870 is shown with a substantially similar height 872 and width 874.

The approximate midpoint along the width 864 of metal feature 860 is indicated by midpoint 866. In the illustrated embodiment, each via 870 is offset from the midpoint 866 of the metal feature 860 above it. Additionally, in the illustrated embodiment, vias 870 are offset alternating left and right from midpoint 866. In an alternate embodiment, vias 870 can be aligned at other points relative to midpoint 866. One skilled in the art will understand that other configurations can also be employed.

Figure 9:
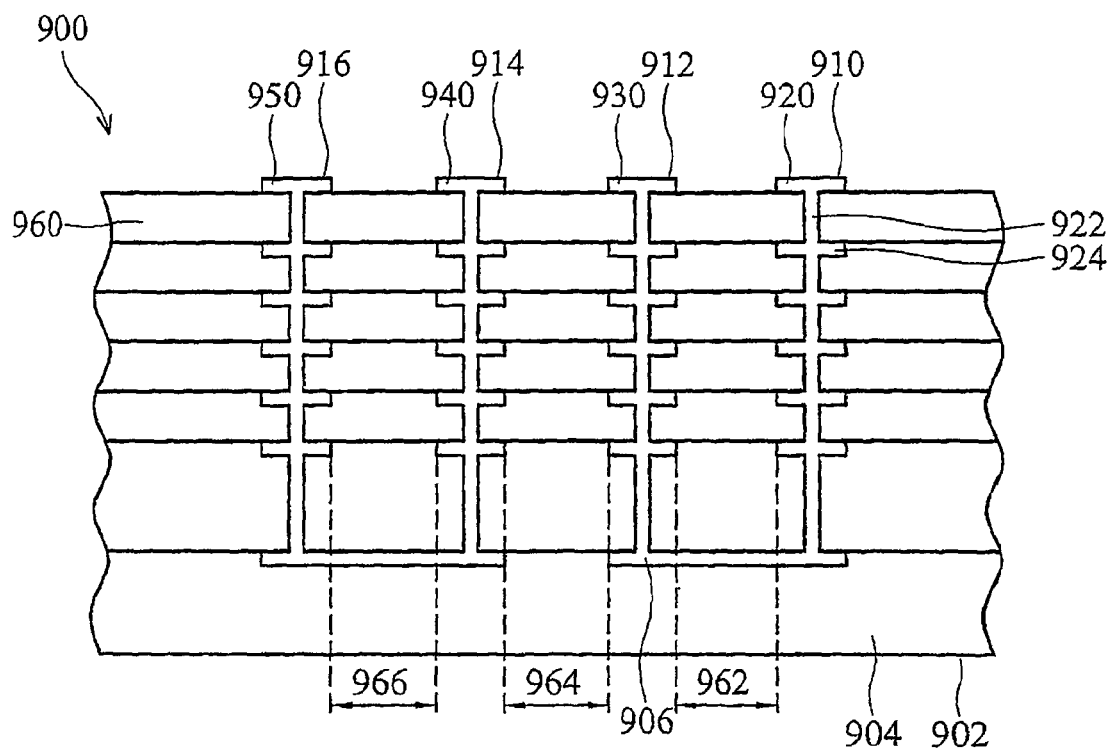
FIGS. 9 and 10 are cross sectional views illustrating features of a preferred embodiment of a semiconductor device fault detection system.

With reference now to FIG. 9, there is shown a cross sectional view illustrating a semiconductor fault detection system, generally indicated by reference numeral 900. In particular, FIG. 9 illustrates a cross sectional of semiconductor die 902 in accordance with one embodiment of the present invention. Semiconductor die 902 includes substrate 904 and passivation layer 960. In the illustrated embodiment, semiconductor die 902 is configured with four fault detection towers 910, 912, 914, and 916. Fault detection towers 910 and 912 and fault detection towers 914 and 916 are configured similarly to fault detection towers 220 and 222 of FIG. 2. Additionally, in the illustrated embodiment, fault detection towers 910, 912, 914, and 916 are configured as pillar-type towers.

Fault detection tower 910 includes contact 920, which couples to passivation layer 960 and the series of vias 922 and trenches 924 between contact 920 and doped region 906, as one skilled in the art will understand. Similarly, fault detection tower 912 includes contact 930, fault detection tower 914 includes contact 940, and fault detection tower 916 includes contact 950. Generally, in operation, fault detection towers 910 and 912 and fault detection towers 914 and 916 perform in a similar manner as fault detection towers 220 and 222 of FIG. 2. One skilled in the art will understand that fault detection towers 910 and 912 and fault detection towers 914 and 916 can be configured "inside" or "outside" a seal ring formed on semiconductor die 902.

Generally, fault detection towers 910 and 912 are configured such that a voltage applied to contact 920 of fault detection tower 910 causes a detectable voltage condition at contact 930 of fault detection tower 912, which varies based on whether there is a detectable fault in semiconductor die 902, as one skilled in the art will understand. One skilled in the art will understand that as fault detection towers 910, 912, 914, and 916 are configured as pillar-type fault detection towers, the volume of semiconductor die 902 covered by any one fault detection tower is less than that covered by a comparable wall-type fault detection tower. Accordingly, fault detection towers 910, 912, 914, and 916 can be configured to maximize an effective coverage area, without requiring a continuous wall-type fault detection tower.

For example, in the illustrated embodiment, fault detection tower 910 is offset from fault detection tower 912 by a distance 962 and fault detection tower 914 is offset from fault detection tower 916 by a distance 966. Distance 962 and distance 966 can be configured based on a pre-determined propensity for a typical semiconductor die to develop faults. For example, as described above, cracks and delamination caused by sawing are more likely to occur at the corners of a semiconductor die. Thus, where fault detection towers 910 and 912, for example, are configured at a corner of semiconductor die 902 and fault detection towers 914 and 916 are configured at a side of semiconductor die 902, distance 962 can be smaller than distance 966. Similarly, fault detection towers 910 and 912 are offset from fault detection towers 914 and 916 by a distance 964. Distance 964 can also be configured based on a pre-determined propensity for a typical semiconductor die to develop faults.

Figure 10:
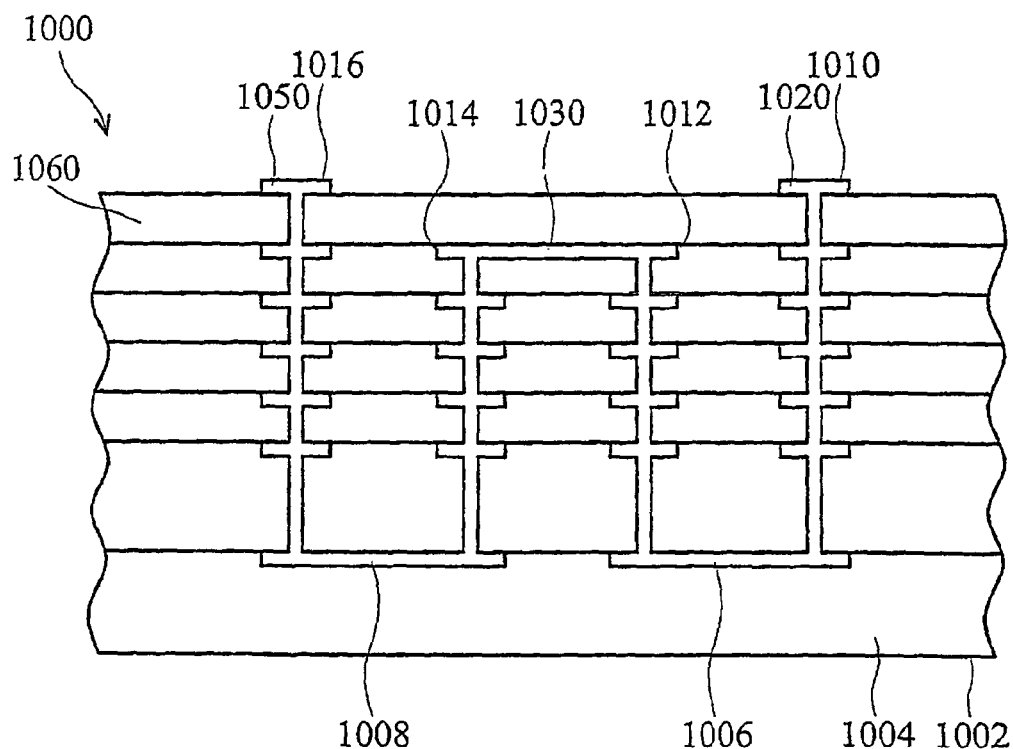

With reference now to FIG. 10, there is shown a cross sectional view illustrating a semiconductor fault detection system, generally indicated by reference numeral 1000. In particular, FIG. 10 illustrates a side view of semiconductor die 1002 in accordance with one embodiment of the present invention. Semiconductor die 1002 includes substrate 1004 and passivation layer 1060.

In the illustrated embodiment, semiconductor die 1002 is configured with four fault detection towers 1010, 1012, 1014, and 1016, which are configured as pillar-type fault detection towers. In the illustrated embodiment, fault detection towers 1010 and 1012 and fault detection towers 1014 and 1016 are configured similarly to fault detection towers 220 and 222 of FIG. 2, with exceptions as described below.

In particular, fault detection tower 1010 is coupled to fault detection tower 1012 and substrate 1004 through doped region 1006 and fault detection tower 1014 is coupled to fault detection tower 1016 and substrate 1004 through doped region 1008. Additionally, fault detection tower 1012 is coupled to fault detection tower 1014 through tower connection 1030. Tower connection 1030 is an electrical conduit and can be a doped region, a metal connection, or other suitable formation configured to form a conductive path between fault detection tower 1012 and fault detection tower 1014. In the illustrated embodiment, tower connection 1030 is formed in the first layer below passivation layer 1060. One skilled in the art will understand that tower connection 1030 can be formed in passivation layer 1060, in another intermediate layer, or otherwise suitably formed.

Fault detection tower 1010 includes contact 1020 and fault detection tower 1016 includes contact 1050. One skilled in the art will understand that fault detection towers 1010, 1012, 1014, and 1016 can be configured "inside" or "outside" a seal ring formed on semiconductor die 1002. Generally, fault detection towers 1012 and 1014 are configured to form a continuous conductive path between fault detection towers 1010 and 1016. Accordingly, a fault that disrupts the conductive path of either fault detection tower 1012 or fault detection tower 1014 also disrupts the conductive path between fault detection towers 1010 and 1016. Thus, fault detection towers 1010, 1012, 1014, and 1016 form a "daisy chain" of pillar-type fault detection towers.

One skilled in the art will understand that this daisy chain can include multiple instances of fault detection towers 1012 and 1014, coupled through tower connections 1030. Therefore, the daisy chain of fault detection towers can be configured to provide a continuous conductive path through semiconductor die 1002, which can be tested through application of a voltage at contact 1020, as described above. In the illustrated embodiment, for example, a voltage test between contact 1020 and contact 1050 can test the continuity of the conductive paths of all four fault detection towers 1010, 1012, 1014, and 1016, thereby reducing the number of fault tests required to make a determination whether any of the conductive paths of the fault detection towers 1010, 1012, 1014, and 1016 have been disrupted.

Thus, fault detection towers 1010, 1012, 1014, and 1016 can be configured to maximize an effective coverage area, particularly when configured as a daisy chain with multiple fault detection towers 1012 and 1014, without requiring a continuous wall-type fault detection tower. The particular number of repetitions of fault detection towers 1012 and 1014, as well as the distances between individual fault detection towers, can be configured based on a pre-determined propensity for a typical semiconductor die to develop faults, as one skilled in the art will understand.

Figure 11:
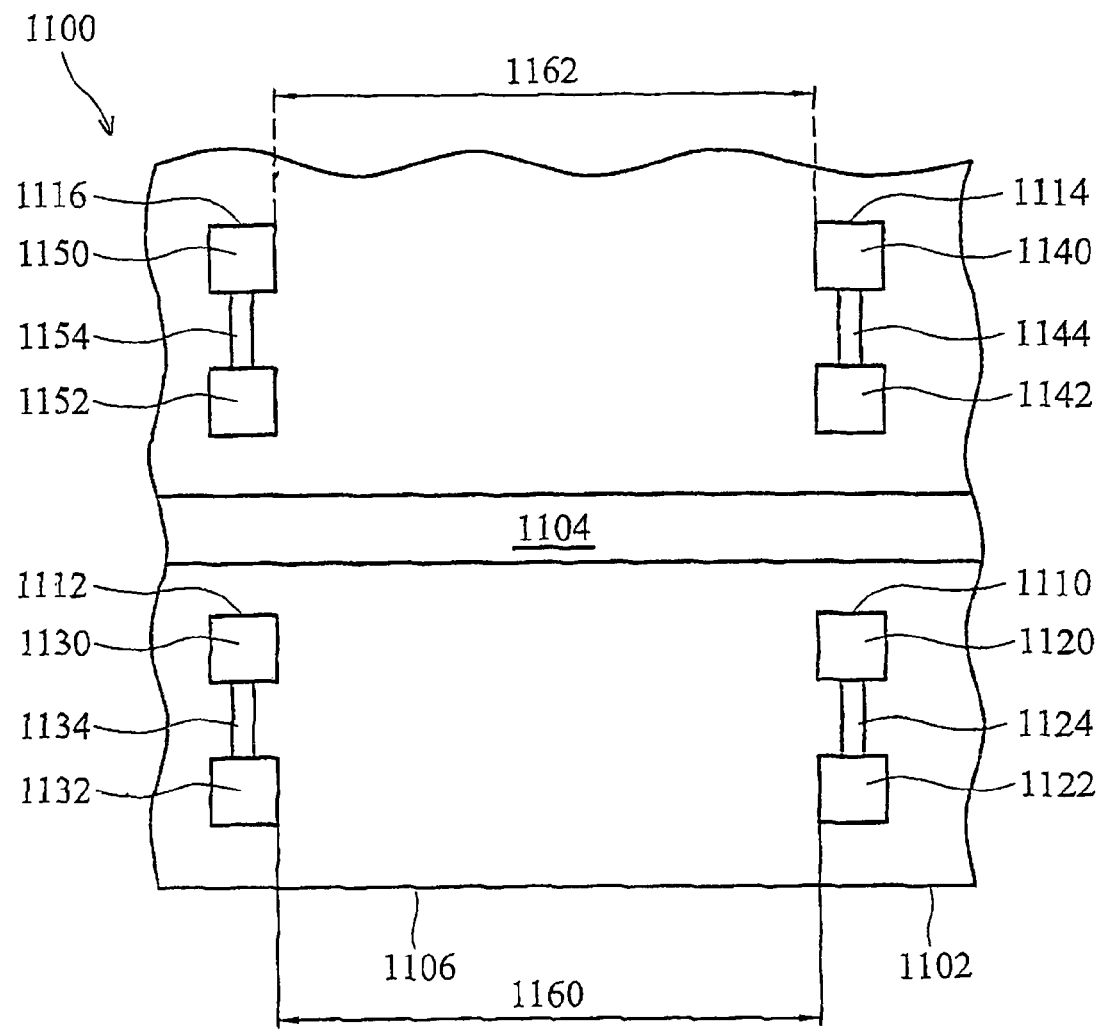
FIGS. 11 and 12 are top views illustrating features of a preferred embodiment of a semiconductor device fault detection system.

With reference now to FIG. 11, there is shown a top view illustrating a semiconductor fault detection device system, generally indicated by reference numeral 1100. In particular, FIG. 11 illustrates a top view of a semiconductor die 1102 with seal ring 1104. Semiconductor die 1102 includes four fault detection chains 1110, 1112, 1114, and 1116. As illustrated, fault detection chains 1110 and 1112 are configured between seal ring 1104 and an outer edge 1106 of semiconductor die 1102. Fault detection chains 1114 and 1116 are configured inside seal ring 1104.

In the illustrated embodiment, each fault detection chain is configured with a number of contacts coupled to one or more fault detection towers. In particular, fault detection chain 1110 includes contacts 1120 and 1122 and fault detection tower 1124. Similarly, fault detection chain 1112 includes contacts 1130 and 1132 and fault detection tower 1134, and fault detection chain 1114 includes contacts 1140 and 1142 and fault detection tower 1144. Fault detection chain 1116 includes contacts 1150 and 1152 and fault detection tower 1154.

Generally, each fault detection chain forms a conductive path through the fault detection towers and contacts, which can be tested to determine the presence of a detectable fault between the two contacts of a fault detection tower, as one skilled in the art will understand. In the illustrated embodiment, the four fault detection chains collectively are arranged with a certain spacing between each chain to identify an approximate location on semiconductor die 1102 where a detected fault lies.

In particular, fault detection chain 1110 and fault detection chain 1112 are separated by a distance 1160 and fault detection chain 1114 and fault detection chain 1116 are separated by a distance 1162. One skilled in the art will understand that distance 1160 and distance 1162 can be configured to optimize the area of semiconductor die 1102 covered by the four fault detection chains. For example, distance 1160 and/or distance 1162 can be configured based on whether the fault detection chains are situated at or near a high-fault-probability section of semiconductor die 1102, such as, for example, a corner of semiconductor die 1102. One skilled in the art will understand that other configurations can also be employed.

Figure 12:
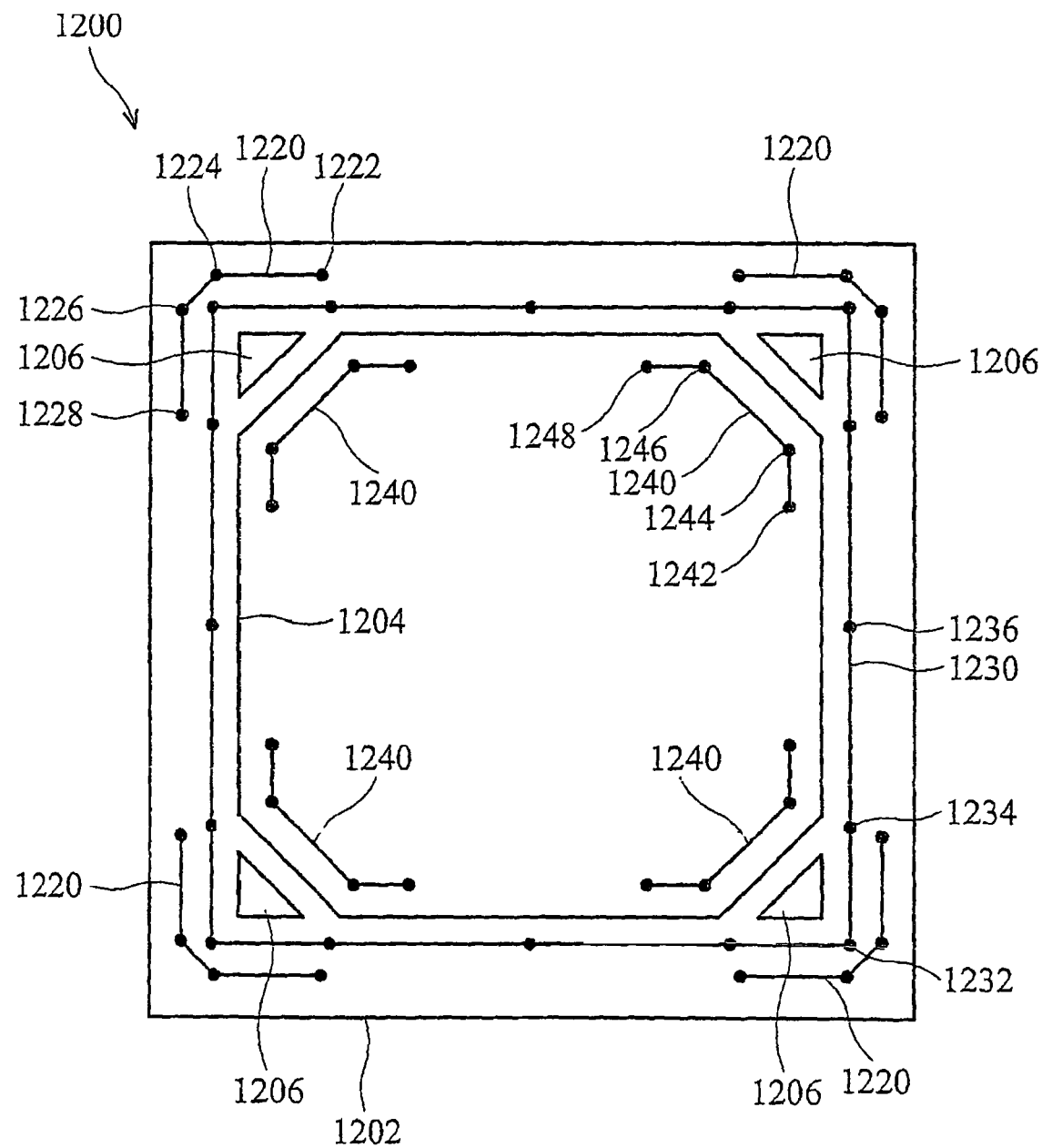

With reference now to FIG. 12, there is shown a top view illustrating a semiconductor fault detection device system, generally indicated by reference numeral 1200. Generally, fault detection device system 1200 depicts a full-die system focusing on detecting faults in the corners of the underlying semiconductor die. In particular, FIG. 12 depicts a semiconductor die 1202. Semiconductor die 1202 includes seal ring 1204, corner blocks 1206 and fault detection chains 1220, 1230, and 1240. Generally, as described above, fault detection chains 1220, 1230, and 1240 are configured to provide conductive paths through which the mechanical and electrical integrity of semiconductor die 1202 can be tested. One skilled in the art will understand that fault detection chains 1220, 1230, and 1240 can be configured in any of the various embodiments as described in more detail above.

In the illustrated embodiment, semiconductor die 1202 includes four fault detection chains 1220. Each fault detection chain 1220 includes contacts 1222, 1224, 1226, and 1228. As illustrated, fault detection chains 1220 are configured to identify whether a fault has developed between a corner block 1206 and an edge of semiconductor die 1202. Thus, fault detection chains 1220, generally, are configured to detect faults at the corners of semiconductor die 1202.

Semiconductor die also includes fault detection chain 1230. As illustrated, fault detection chain 1230 is a continuous loop encircling seal ring 1204 between seal ring 1204 and the edge of semiconductor die 1202. Fault detection chain 1230 includes corner contacts 1232, near corner contacts 1234, and side contacts 1236. In the illustrated embodiment, corner contacts 1232 are situated near the corners of semiconductor die 1202. Similarly, near corner contacts 1234 are situated near the corners of the corner blocks 1206 and side contacts 1236 are generally situated midway between adjacent near corner contacts 1234. One skilled in the art will understand that a test of the conductive path formed by fault detection chain 1230 can identify whether the conductive path remains continuous. If the conductive path of fault detection chain 1230 is disrupted by a fault, various tests at the assorted contacts 1232, 1234, and 1236 can identify where on semiconductor die 1202 a detected fault lies.

Semiconductor die 1202 includes four fault detection chains 1240. Each fault detection chain 1240 includes contacts 1242, 1244, 1246, and 1248. One skilled in the art will understand that, as illustrated, fault detection chains 1220 are configured to identify whether a fault has developed near a corner block 1206, inside seal ring 1204, as described above. Thus, fault detection chains 1240, generally, are configured to detect faults at the corners of semiconductor die 1202, within seal ring 1204.

Accordingly, the combination of fault detection chains 1220, 1230, and 1240 is configured to generally identify whether a fault had developed on semiconductor die 1202, which corner has developed the fault, and whether the fault extends through seal ring 1240. For example, a test of fault detection chain 1230 can identify whether a fault has developed on semiconductor die 1202 that threatens the integrity of seal ring 1204. If a fault is detected, a test of the fault detection chains 1220 can identify in which corner or corners, if any, the fault has developed. Similarly, once the corner has been identified, a test of the corresponding fault detection chain 1240 can identify whether the detected fault likely extends through seal ring 1204.

One skilled in the art will understand that other testing patterns and fault detection chain configurations can also be employed, without departing from the spirit or scope of the present invention, as described above. Thus, fault detection device system 1200 can be configured to identify a variety of faults in semiconductor die 1202, including an approximate extent of a detected fault and whether that fault extends through seal ring 1204, without requiring destructive or otherwise expensive testing.

Figure 13:
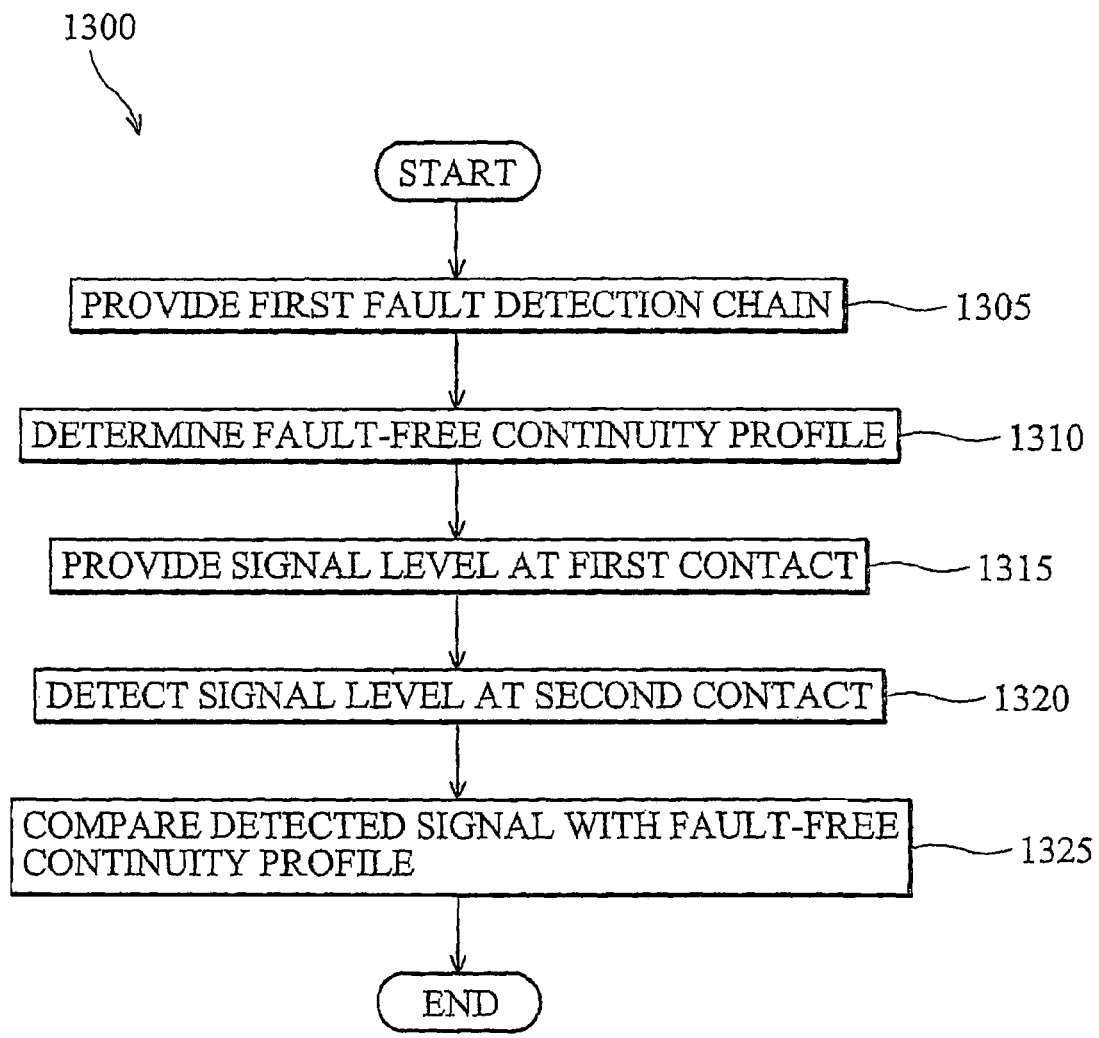
FIG. 13 is a flow diagram illustrating a preferred embodiment of a semiconductor device fault detection method.

With reference now to FIG. 13, there is shown a flow diagram illustrating a semiconductor fault detection device method, generally indicated by reference numeral 1300. One skilled in the art will understand that the process steps are applicable to the relevant structures in the foregoing figures.

The process begins at step 1305, wherein a first fault detection chain is provided. The first fault detection chain can be any of the fault detection structures described above. One skilled in the art will understand that this step can be performed contemporaneously with the manufacture and/or build-up of other components on an integrated circuit. For ease of illustration, the remaining steps of the method are described with respect to a fault detection chain with at least two contact pads. One skilled in the art will understand that the method can be appropriately modified to account for a different number of contact pads.

At next step 1310, a fault-free continuity profile is determined. Generally, this step entails identifying a continuity profile of the first fault detection chain absent a detectable fault in the semiconductor device in which the first fault detection chain is employed. One skilled in the art will understand that this step can include simply measuring a voltage between two contact pads where it is known that the conductive path between the two contact paths is uninterrupted. Also, one skilled in the art will understand that this step can be simulated in a design and/or laboratory environment, for subsequent use of the continuity profile in a manufacturing and/or testing environment.

At next step 1315, a signal level is provided at a first contact of the first fault detection chain. As described above, this step can include applying a known voltage to the first contact pad of the first fault detection chain. At next step 1320, a signal level is detected at a second contact of the first fault detection chain. This step can include measuring a voltage at the second contact pad of the first fault detection chain. As described above, the first and second contact pads can be disposed at endpoints of the first fault detection chain, or one or both of the first and second contact pads can be disposed between endpoints of the first fault detection chain. One skilled in the art will understand that the signal level detected at the second contact travels from the first contact through the conductive path between the two contacts, as described above.

At next step 1325, the signal level detected at the second contact is compared with the fault-free continuity profile of step 1310 and the process ends. Thus, generally, the fault-free continuity profile provides an estimate of what the signal level detected at the second contact should be, absent a detectable fault. One skilled in the art will understand that a deviation from the fault-free continuity profile can therefore indicate a detectable fault in the integrated circuit.

Additionally, one skilled in the art will understand that the above process steps can be repeated for additional fault detection chains. For example, a second fault detection chain can be provided, with an associated fault-free continuity profile. A signal level provided at a first contact of the second fault detection chain can be detected at a second contact of the second fault detection chain and compared with the second fault-free continuity profile. Thus, as described above, the orientation and disposition of the first and second fault detection chains can allow testing that provides additional specificity as to the presence and extent of a detected fault.

Although the present invention and its advantages have been described in detail, it should be understood that various changes, substitutions and alterations can be made herein without departing from the spirit and scope of the invention as defined by the appended claims. For example, the above embodiments include details concerning the number and type of fault detection towers and fault detection chains. One skilled in the art will understand that other configurations of pillar-type fault detection towers and wall-type fault detection towers can also be employed. As another example, it will be readily understood by those skilled in the art that the particular combinations of fault detection towers and fault detection chains illustrated may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for detecting faults in an integrated circuit comprising:
   a circuit region with at least a first side and a second side, the first side and the second side intersecting and being straight, the first side and second side extending in different directions;
   a seal ring;
   an outer border of the integrated circuit;
   at least one fault detection chain between the outer border and the circuit region, the fault detection chain comprising:
      a first contact pad and a second contact pad, the first contact pad located between the second side and the outer border and the second contact pad being the closest contact pad to the first contact pad and wherein the first contact pad and second contact pad are electrically connected by at least one conductive pathway of a conductive material that allows current to flow from the first contact pad to the second contact pad without passing through the substrate, wherein the conductive pathway has a smaller width in a direction from the first contact pad to the second contact pad than the first contact pad or the second contact pad;

a third contact pad located between the first side and the outer border;

a metal feature coupled to the first and the second contact pad by a first and a second via; and a dielectric interposed between the first and second contact pads.

2. The system of claim 1, wherein at least a first one of the plurality of fault detection chains comprises a concentric ring.

3. The system of claim 1, further comprising a second fault detection chain.

4. The system of claim 3, wherein the first and second fault detection chains are both outside the seal ring.

5. The system of claim 3, wherein the first fault detection chain is outside the seal ring and the second fault detection chain is inside the seal ring.

6. The system of claim 3, further comprising a third fault detection chain.

7. The system of claim 6, wherein the first and second fault detection chains are both outside the seal ring and the third fault detection chain is inside the seal ring.

8. The system of claim 6, wherein the first fault detection chain is outside the seal ring and the second and third fault detection chains are both inside the seal ring.

9. The system of claim 1, wherein the first fault detection chain comprises a series of substantially vertically aligned towers of electrically coupled metal features extending from a top level metal layer to a substrate contact layer.

10. An integrated circuit having an outer border comprising:

a circuit region;

a seal ring adjacent said outer border;

a first fault detection chain structure disposed between the seal ring and the outer border, the first fault detection chain structure including a first plurality of top level metal contacts, the first plurality of top level metal contacts electrically coupled to a first substrate contact and comprising a first top level metal contact located adjacent a first side of the seal ring and a second top level metal contact adjacent a second side of the seal ring, the first top level metal contact and the second top level metal contact connected by a straight metal line that allows current flow from the first top level metal contact to the second top level metal contact without passing through the substrate, the metal line having a width in a direction from the first top level metal contact to the second top level metal contact smaller than a width of the first top level metal contact or of the second top level metal contact; and a second fault detection chain structure disposed between the seal ring and the circuit region and including a second top level metal contact electrically coupled to a second substrate contact.

11. The integrated circuit of claim 10 wherein the first substrate contact is electrically coupled to the second substrate contact.

12. The integrated circuit of claim 10 wherein the second substrate contact is electrically coupled to a third substrate contact.

13. A method for detecting faults in an integrated circuit comprising:

providing a seal ring;

providing a first series of fault detection features at pre-defined spaced distances from an outer edge of the integrated circuit; at least two of the first series of fault detection features being electrically coupled to each other, wherein at least one of the fault detection features comprises a plurality of contact pads, wherein at least a first one of the plurality of contact pads is located adjacent to a linear first side of the integrated circuit and a second one of the plurality of contact pads is located adjacent to a linear second side of the integrated circuit, the second side of the integrated circuit intersecting the first side of the integrated circuit and extending in a different direction than the first side of the integrated circuit, the first one of the plurality of contact pads and the second one of the plurality of contact pads being connected by a metal feature independently from the seal ring, the metal feature having a width in a direction from the first one of the plurality of contact pads to the second one of the plurality of contact pads smaller than a width of the first one of the plurality of contact pads or of the second one of the plurality of contact pads;

providing a signal level at one of the plurality of contact pads of a first one of the first series of fault detection features; and detecting a response signal level at a second one of the first series of fault detection features.

14. The method of claim 13 wherein the first series of fault detection features is disposed between the outer edge and the seal ring of the integrated circuit.

15. The method of claim 13 wherein the first series of fault detection features is disposed inside the seal ring of the integrated circuit.

16. The method of claim 13 wherein the first series of fault detection features comprise a concentric fault detection ring.

17. The method of claim 13, further comprising:

providing a second series of fault detection features at pre-defined spaced distances from the first series of fault detection features; at least two of the second series of fault detection features being electrically coupled;

providing a signal level at a first one of the second series of fault detection features; and detecting a response signal level at a second one of the second series of fault detection features.

18. The method of claim 17 wherein the first series is between the edge and the seal ring of the integrated circuit and the second series is inside the seal ring.

19. The method of claim 17, further comprising:

providing a third series of fault detection features at pre-defined spaced distances from the seal ring of the integrated circuit; at least two of the third series of fault detection features being electrically coupled;

providing a signal level at a first one of the third series of fault detection features; and detecting a response signal level at a second one of the third series of fault detection features.

20. The method of claim 19 wherein the first and second series is between the edge and the seal ring and the third series is inside the seal ring.

* * * * *